(12) United States Patent
Driemel (10) Patent No.: US 9,841,473 B2
(45) Date of Patent: Dec. 12, 2017

(54) MR SURFACE COIL WITH INTEGRATED AUTOMATIC PATIENT IMMOBILIZATION

(71) Applicant: Daniel Driemel, Oederan (DE)

(72) Inventor: Daniel Driemel, Oederan (DE)

(73) Assignee: Siemens Aktiengesellschaft, München (DE)

( * ) Notice: Subject to any disclaimer, the term of this patent is extended or adjusted under 35 U.S.C. 154(b) by 1153 days.

(21) Appl. No.: 13/957,402

(22) Filed: Aug. 1, 2013

(65) Prior Publication Data

US 2014/0039301 A1 Feb. 6, 2014

(30) Foreign Application Priority Data

Aug. 1, 2012 (DE) .................. 10 2012 213 594

(51) Int. Cl.
*A61B 5/05* (2006.01)
*G01R 33/34* (2006.01)

(52) U.S. Cl.
CPC .............. *G01R 33/34084* (2013.01)

(58) Field of Classification Search
CPC ............................. G01R 33/34084
USPC ................................. 600/407–430
See application file for complete search history.

(56) References Cited

U.S. PATENT DOCUMENTS

| | | | | |
|---|---|---|---|---|
| 5,274,332 A | * | 12/1993 | Jaskolski | G01R 33/34007 324/318 |
| 5,427,103 A | * | 6/1995 | Fujio | A61B 1/0051 600/101 |
| 5,664,568 A | * | 9/1997 | Srinivasan | G01R 33/3657 324/318 |
| 5,783,943 A | * | 7/1998 | Mastandrea, Jr. | G01R 33/385 324/318 |
| 5,864,234 A | * | 1/1999 | Ludeke | G01R 33/3415 324/307 |
| 5,929,639 A | * | 7/1999 | Doty | G01R 33/34069 324/309 |
| 5,952,830 A | * | 9/1999 | Petropoulos | G01R 33/385 324/318 |
| 6,023,166 A | * | 2/2000 | Eydelman | G01R 33/34053 324/318 |
| 6,144,203 A | * | 11/2000 | Richard | G01R 33/34053 324/318 |

(Continued)

FOREIGN PATENT DOCUMENTS

DE 103 14 215 B4 11/2006

OTHER PUBLICATIONS

German Office Action dated Jan. 31, 2013 for corresponding German Patent Application No. DE 10 2012 213 594.4 with English translation.

*Primary Examiner* — Sanjay Cattungal
(74) *Attorney, Agent, or Firm* — Lempia Summerfield Katz LLC (57) ABSTRACT

A magnetic resonance tomography (MRT) local coil includes at least two parts that may be moved relative to one another. At least one part of the at least two parts has elements that, in a closed state of the MRT local coil, presses directly or via pressure elements on at least one closed volume area in another part of the at least two parts. The at least one closed volume area is displaced by this in the closed state of the local coil into a coil interior space inside the local coil until the closed volume area rests against a patient.

26 Claims, 5 Drawing Sheets

(56) References Cited

U.S. PATENT DOCUMENTS

| | | | | |
|---|---|---|---|---|
| 6,577,888 B1* | 6/2003 | Chan | G01R 33/3415 | 324/318 |
| 6,591,128 B1* | 7/2003 | Wu | G01R 33/34084 | 324/318 |
| 6,636,040 B1* | 10/2003 | Eydelman | G01R 33/34053 | 324/318 |
| 6,727,698 B1* | 4/2004 | Eydelman | G01R 33/34053 | 324/318 |
| 6,847,210 B1* | 1/2005 | Eydelman | G01R 33/341 | 324/318 |
| 6,943,551 B2 | 9/2005 | Eberler et al. | | |
| 7,221,160 B2* | 5/2007 | Leussler | G01R 33/3415 | 324/318 |
| 7,701,209 B1* | 4/2010 | Green | G01R 33/307 | 324/307 |
| 7,728,592 B2* | 6/2010 | Ma | G01R 33/307 | 324/318 |
| 2004/0251902 A1* | 12/2004 | Takagi | G01R 33/3456 | 324/318 |
| 2006/0173390 A1* | 8/2006 | Van Wyk | A61B 6/0421 | 602/6 |
| 2006/0244448 A1* | 11/2006 | Ballon | G01R 33/34046 | 324/318 |
| 2007/0152667 A1* | 7/2007 | Schubert | G01R 33/34046 | 324/318 |
| 2008/0129298 A1* | 6/2008 | Vaughan | G01R 33/583 | 324/322 |
| 2010/0066367 A1* | 3/2010 | Ma | G01R 33/307 | 324/318 |
| 2010/0066368 A1* | 3/2010 | Gao | G01R 33/307 | 324/318 |
| 2011/0037470 A1* | 2/2011 | Driemel | G01R 33/36 | 324/318 |
| 2011/0040174 A1* | 2/2011 | Driemel | G01R 33/34007 | 600/422 |
| 2011/0210735 A1* | 9/2011 | Trakic | G01R 33/5659 | 324/309 |
| 2012/0153956 A1* | 6/2012 | Driemel | G01R 33/34007 | 324/322 |

\* cited by examiner

MR SURFACE COIL WITH INTEGRATED AUTOMATIC PATIENT IMMOBILIZATION

This application claims the benefit of DE 10 2012 213 594.4, filed on Aug. 1, 2012, which is hereby incorporated by reference.

BACKGROUND

The present embodiments relate to a magnetic resonance tomography (MRT) local coil.

Magnetic resonance tomography devices (MRTs) for the examination of objects or patients using magnetic resonance tomography are known, for example, from DE10314215B4.

SUMMARY

The scope of the present invention is defined solely by the appended claims and is not affected to any degree by the statements within this summary.

The present embodiments may obviate one or more of the drawbacks or limitations in the related art. For example, a magnetic resonance tomography (MRT) local coil is optimized.

DETAILED DESCRIPTION

Figure 5:
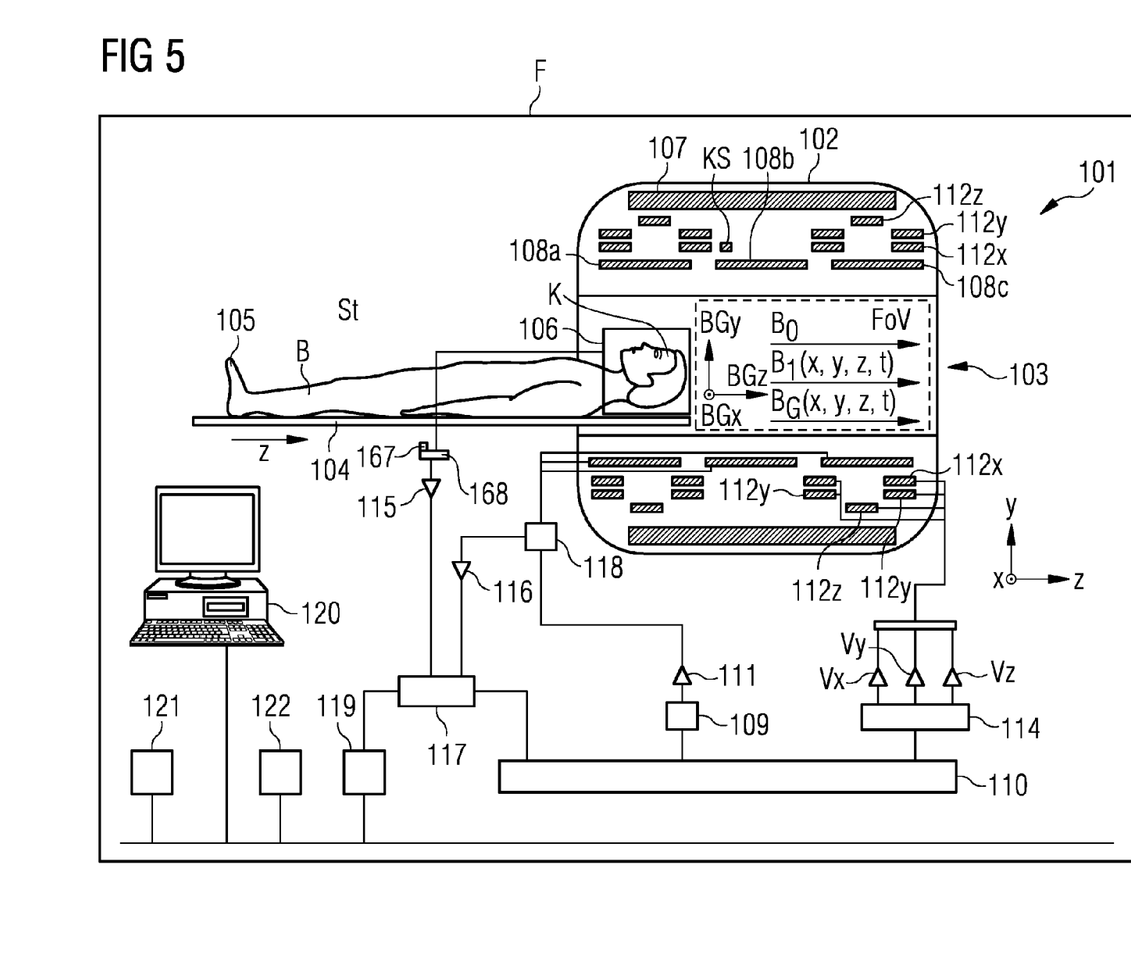
FIG. 5 shows a schematic view of one embodiment of a magnetic resonance tomography (MRT) system.

FIG. 5 shows one embodiment of an imaging magnetic resonance tomography device MRT 101 (e.g., situated in a shielded chamber or Faraday cage F) having a whole body coil 102, for example, with a tube-shaped chamber 103, into which a patient table 104 carrying a body, for example, of an examination subject 105 (e.g., of a patient; with or without local coil arrangement 106) may be transported in the direction of the arrow z in order to generate recordings of the patient 105 using an imaging method. Arranged on the patient (e.g., on the head K) is a local coil arrangement 106 by which, in a local region (e.g., field of view (FOV)) of the MRT 101, recordings of a partial region of the body 105 in the FOV may be generated. Signals from the local coil arrangement 106 may be evaluated (e.g., converted into images, stored or displayed) by an evaluation unit (e.g., including elements 168, 115, 117, 119, 120, 121) of the MRT 101 that may be connected, for example, via coaxial cable or wirelessly (e.g., element 167) to the local coil arrangement 106.

In order to examine the body 105 (e.g., the examination subject or the patient) using a magnetic resonance imaging process using a magnetic resonance tomography device MRT 101, different magnetic fields that are coordinated with one another as precisely as possible with respect to temporal and spatial characteristics are irradiated onto the body 105. A strong magnet (e.g., a cryomagnet 107) in a measuring cabin, having a tunnel-shaped opening 103, for example, generates a static strong main magnetic field $B_0$ that, for example, has a strength of 0.2 tesla to 3 tesla or even more. A body 105 to be examined, supported on a patient table 104, is transported into an area of the main magnetic field B0, which is approximately homogeneous in the FOV. An excitation of the nuclear spins of atomic nuclei of the body 105 takes place via magnetic high-frequency excitation pulses B1 (x, y, z, t) that are irradiated in via a high-frequency antenna (and/or where applicable a local coil arrangement) represented in FIG. 5 in very simplified form as a body coil 108 (e.g., a multi-part body coil 108a, 108b, 108c). High-frequency excitation pulses are generated, for example, by a pulse generation unit 109 that is controlled by a pulse sequence control unit 110. After being amplified by a high-frequency amplifier 111, the pulses are fed to the high-frequency antenna 108. The high-frequency system shown in FIG. 5 is suggested only in schematic form. In other embodiments, more than one pulse generation unit 109, more than one high-frequency amplifier 111 and a plurality of high-frequency antennas 108a, b, c are employed in a magnetic resonance device 101.

The magnetic resonance device 101 has gradient coils 112x, 112y, 112z by which magnetic gradient fields $B_G(x, y, z, t)$ for selective layer excitation and for position encoding of the measurement signal are irradiated in during a measurement. The gradient coils 112x, 112y, 112z are controlled by a gradient coil control unit 114 (and where applicable via amplifiers Vx, Vy, Vz) that, in the same manner as the pulse generation unit 109, is connected to the pulse sequence control unit 110.

Signals emitted by the excited nuclear spins (e.g., of the atomic nuclei in the examination subject) are received by the body coil 108 and/or at least one local coil arrangement 106, amplified by associated high-frequency preamplifiers 116 and processed further and digitized by a receive unit 117. The measurement data recorded is digitized and stored as complex numerical values in a k-space matrix. An associated MR image may be reconstructed from the values contained in the k-space matrix using a multi-dimensional Fourier transform.

For a coil that may be operated both in send mode and also in receive mode, such as, for example, the body coil 108 or a local coil 106, the correct signal forwarding is regulated through a send/receive switch 118 connected upstream.

From the measurement data, an image processing unit 119 generates an image that is displayed to a user via an operator console 120 and/or is stored in a storage unit 121. A central processor unit 122 controls the individual system components.

In MR tomography, images having a high signal-to-noise ratio (SNR) are captured by using local coil arrangements (e.g., coils, local coils). The local coil arrangements are antenna systems that are placed in the immediate vicinity on (anterior), below (posterior), against, or in the body 105. When an MR measurement is performed, the excited nuclei induce a voltage in the individual antennas of the local coil. The induced voltage is amplified by a low-noise preamplifier (e.g., LNA, Preamp) and is forwarded to the receive electronics. High-field systems (e.g., 1.5 T-12 T or more) are employed in order to improve the signal-to-noise ratio even in the case of high-resolution images. If more individual antennas may be connected to an MR receive system than there are receivers present, a switching matrix (e.g., RCCS), for example, is incorporated between receive antennas and the receiver. The switching matrix routes the presently active receive channels (e.g., the receive channels that are currently situated in the field of view of the magnet) to the available receivers. As a result, more coil elements than there are receivers present may be connected since in the case of a whole body coverage, the coils that are situated in the FOV or in the homogeneity volume of the magnet are read out.

A local coil arrangement 106 is, for example, an antenna system that may include one antenna element or an array coil including a plurality of antenna elements (e.g., coil elements). The individual antenna elements are implemented, for example, as loop antennas (e.g., loops), butterfly, flex coils or saddle coils. A local coil arrangement includes, for example, coil elements, a preamplifier, further electronics (e.g., RF chokes), a housing, supports and may include a cable with connector by which the local coil arrangement is connected to the MRT system. A receiver 168 fitted on the system side filters and digitizes a signal received from a local coil 106, for example, in wireless fashion and passes the data to a digital signal processing unit that at least partially derives an image or a spectrum from the data obtained by a measurement and makes the image or spectrum available to the user, for example, for subsequent diagnosis by the user and/or for storage.

FIGS. 1-4 show embodiments of local coils.

In MR tomography, images having a high signal-to-noise ratio (SNR) are captured by using local coils (e.g., coils, local coils). The local coils are antenna systems that are placed in the immediate vicinity on (anterior) or under (posterior) the patient. When an MR measurement is performed, the excited nuclei induce a voltage in the individual antennas of the local coil. The induced voltage is amplified by a low-noise preamplifier (for example LNA, Preamp) and is forwarded in wired fashion to the receive electronics. High-field systems (e.g., 1.5 T to 12 T or also more) are employed in order to improve the signal-to-noise ratio even in the case of high-resolution images. Since more individual antennas may be connected to an MR receive system than there are receivers present, a switching matrix (e.g., RCCS) is incorporated between receive antennas and the receiver. The switching matrix routes the presently active receive channels (e.g., receive channels that are currently situated in the FOV of the magnet) to the available receivers. As a result, more coil elements than there are receivers present may be connected since in the case of a whole body coverage, the coils that are situated in the FOV or in the homogeneity volume of the magnet are to be read out.

A "coil" (e.g., a local coil or MRT local coil) is, for example, an antenna system that may include one, or in the case of an array coil a plurality of antenna elements (e.g., coil elements). The individual antenna elements may be implemented as loop antennas (e.g., loops), butterfly coils or saddle coils. A coil 106 includes the coil elements, the preamplifier, further electronics (e.g., RF chokes etc.), cabling, the housing and may include a cable with connector by which the coil is connected to the MR system. The receiver (RX) fitted on the system side filters and digitizes the signal received from the local coil and passes the data to the digital signal processing device, which derives an image or a spectrum from a measurement, stores the image or spectrum where applicable, and makes the image or spectrum available for diagnosis.

In order to achieve an optimum image quality, during the MR measurement, the patient may lie calmly and without changing his position in or on the respective MR coil. In addition to placing the MR coil in position, additional measures may be provided for patient immobilization. With regard to head examinations, the patient may be immobilized in stable fashion in order to prevent head movements caused, for example, by breathing or swallowing. However, the support for the extremities of the patient may also be well immobilized (e.g., implemented to be free of movement).

According to the prior art, the patient is immobilized in the MR coil by additional immobilization elements (e.g., user placeable cushions). Additional manual actions are provided, and the prior art is not optimally suited for every patient. For example, in the case of head examinations, the head of the patient is positioned on a foam part in the head coil lower part. This cushion cushions the rear of the head of the patient in order to prevent pressure points resulting from the solid housing of the head coil lower part. The cushion is flat in order to offer the patient space laterally to be able to place himself into the coil. The movements of the head to the left and right are restricted, for example, by additional cushions that are placed between the coil housing and the head of the patient. The additional cushions are, however, impractical to use after the patient has been positioned, and the coil has been closed. Often, the hair of the patient or very closed coil housings (e.g., no openings or windows) resulting from a high number of channels impede the optimal positioning of the cushions. In the past, in the case of head coils having a small number of channels, clamping jaws have been used. These parts passed through openings on the left and right in the coil housing and were pushed towards the head on both sides until the head was quasi "clamped in," and a lateral movement of the head was thus prevented. Additional manual actions on the part of the operating personnel are to be provided in the prior art. The solutions of the prior art restricted patient comfort and were not workflow optimal. Similar approaches are also employed in order to immobilize, for example, knee joint, ankle joint and wrist joint. In these cases, immobilization cushions may be used rather than clamping jaws.

An embodiment, by way of example, of a head coil 106 with a patient immobilization device that is integrated into a closing operation (arrow S) of the local coil 106 and automatically immobilizes the patient without additional effort is described in the following. The principle may also be employed in other volume coils (e.g., head, neck, knee, foot, wrist local coils and others). The local coil 106 includes at least two parts 2, 3, or at least two parts 2, 3 are moved relative to one another. In one embodiment, the local coil 106 includes one part. The coil 106 may include a coil lower part 3 and a coil upper part 2, which enables the coil 106 to be opened, thus allowing the patient a comfortable entry.

Figure 1:
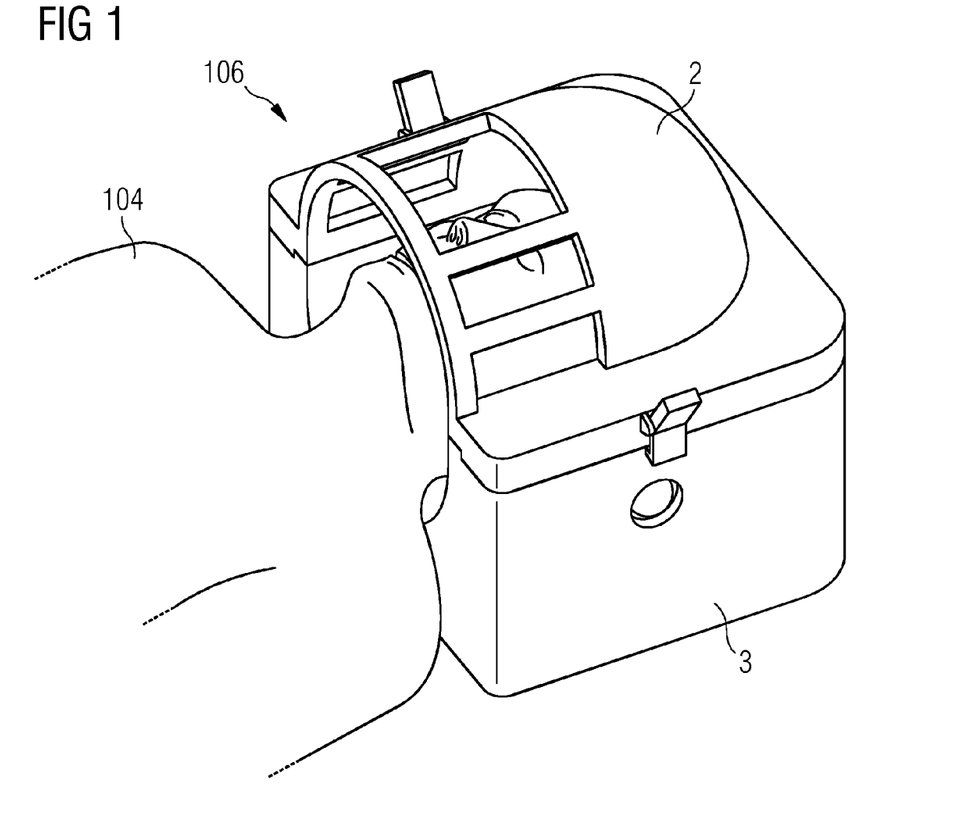
FIG. 1 shows a perspective and simplified view of one embodiment of a local coil having a local coil lower part and local coil upper part, and a patient.
Figure 2:
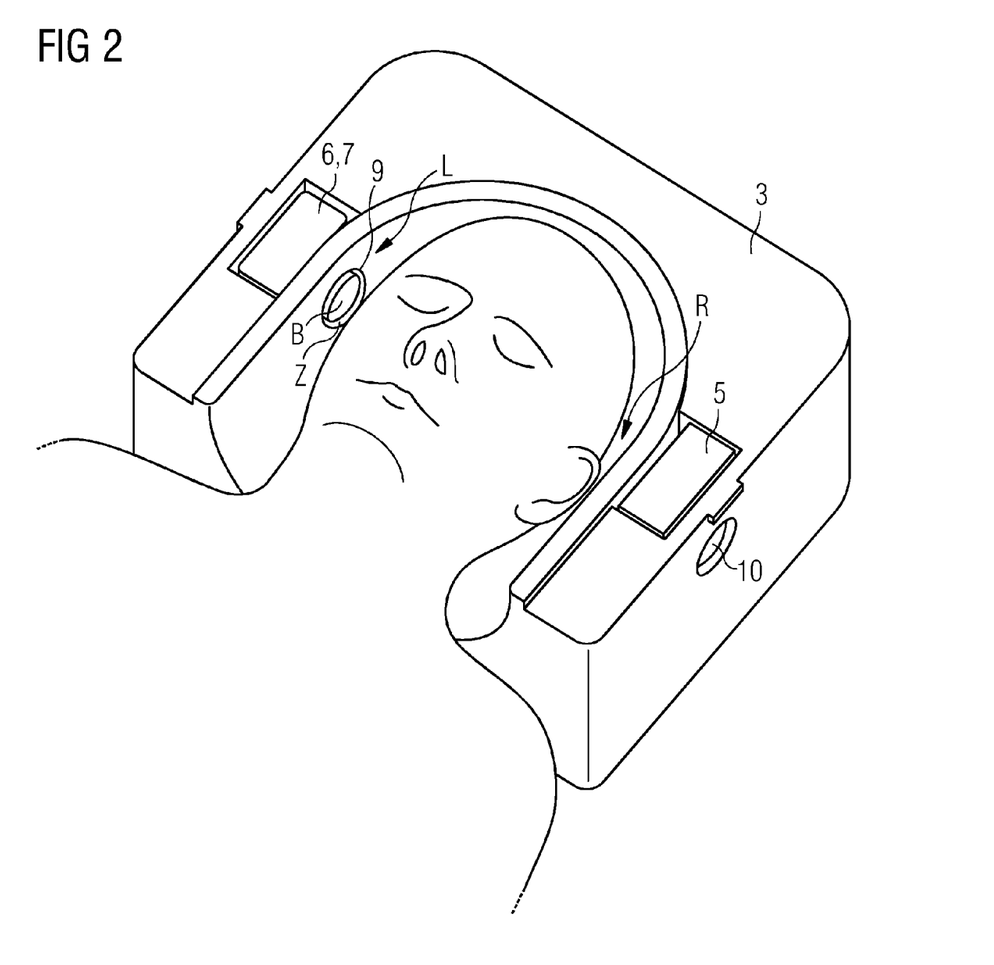
FIG. 2 shows a perspective and simplified view of the head of a patient in one embodiment of a local coil lower part.

The MRT local coil 106 includes a local coil lower part 3 and a local coil upper part 2. In FIG. 1 the head coil 106 includes a head coil upper part 2 and a head coil lower part 3.

Figure 3:
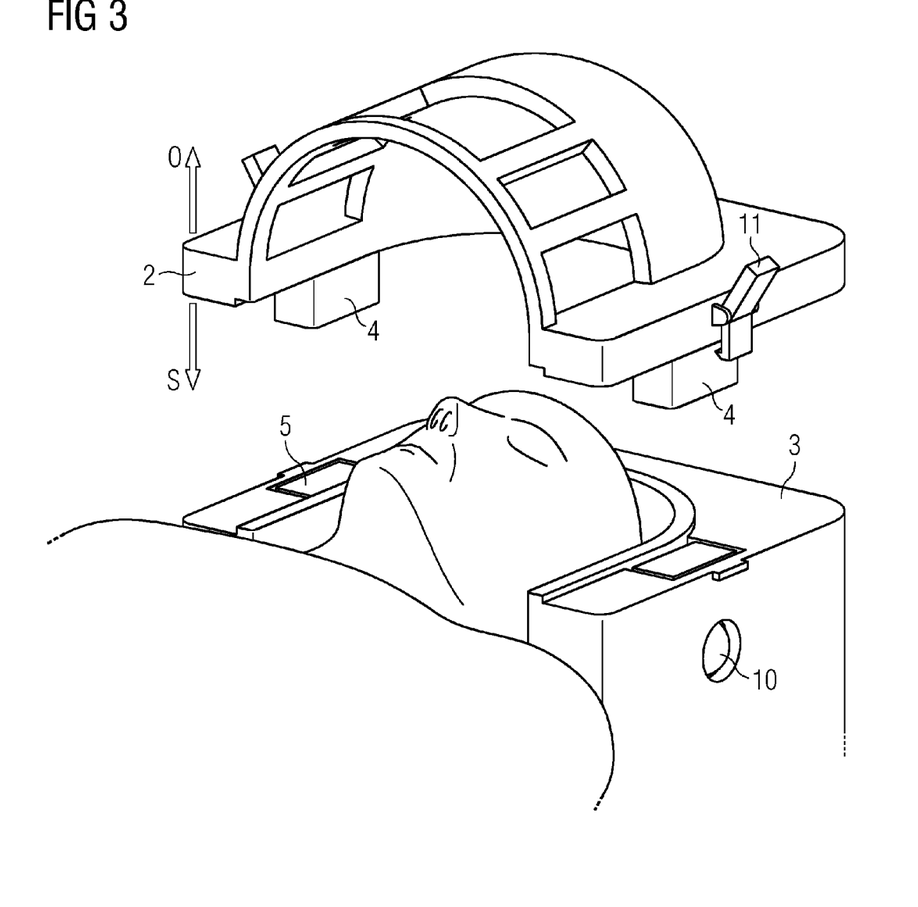
FIG. 3 shows a perspective and simplified view of one embodiment of a local coil upper part that is separated from a local coil lower part.
Figure 4:
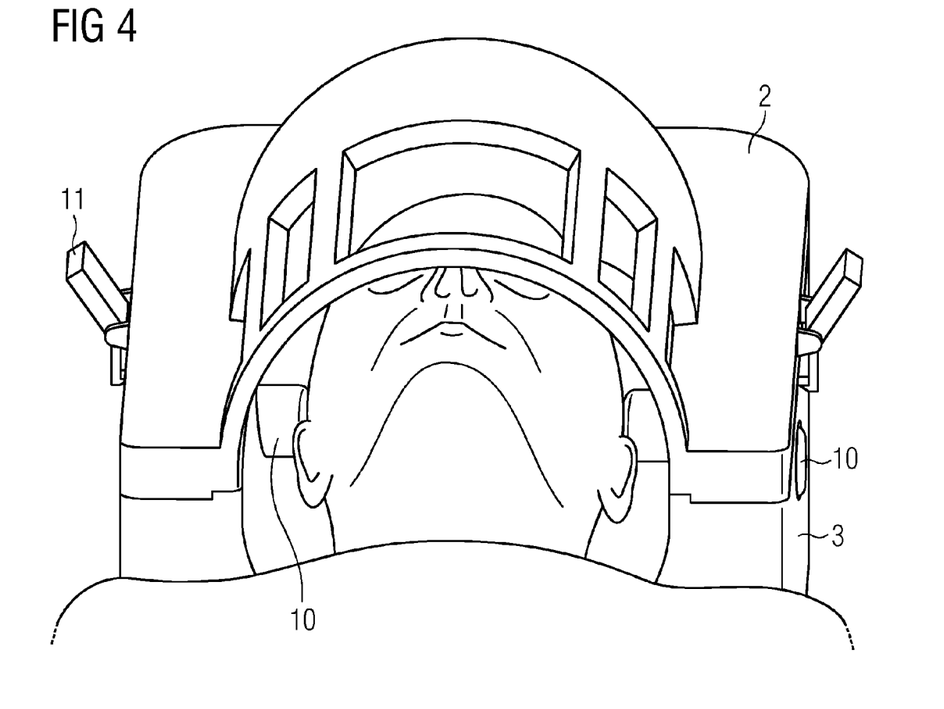
FIG. 4 shows a perspective and simplified view of one embodiment of a local coil upper part that is located in position on a local coil lower part and presses volume areas of the local coil lower part against the head of a patient in order to immobilize the head by filling a space in the local coil.

As shown in FIG. 3, the head coil upper part 2 has one or more elements 4 projecting during the closure operation (S) (e.g., located in front of the remainder of the part 3 in the direction S), which reach the head coil lower part 3 before the coil 106 has completely closed (e.g., into an arrangement according to FIG. 4). During the closure operation, the one or more elements press directly or, as shown in FIG. 3, via pressure elements 5 (e.g., to give a planar pressure distribution) in the head coil lower part 3 onto one or more closed (e.g., sealed so that the medium (gas or fluid) therein is unable to escape) sealed volume areas 6 (e.g., cushions or bodies enclosed by a membrane).

The closed volume areas (e.g., closed volumes) 6 are enclosed by an elastic membrane 7 and include a medium 8 (e.g., air or another gas or a fluid). At least one membrane 7 in the head coil lower part 3 has at least one zone Z (e.g., one zone Z on each of the left-hand side and right-hand side of the head of the patient) in an inside of the local coil 106. The at least one zone Z has direct access, for example, through an opening 9 in the housing to a coil interior space (i.e., a volume area is able to expand into the inside of the local coil). An expandable area B (e.g., at least on a coil inner surface of the membrane) of the at least one membrane 7 may, for example, have the form of a bellows. When the head coil upper part 2 is pressed onto the head coil lower part 3 during closure (S) of the head coil 106, the volume areas 6 are deformed and displaced such that the volume areas 6 (e.g., the expandable area B at least on the coil inner surface of the membrane 7) pass, via the expandable membrane area B, through the openings 9 until the volume areas 6 rest against (e.g., with or without pressure contact) a patient contour (e.g., the head K, an ear or distally thereabove) and thus fill a previously free space between the patient and the coil housing.

The movement of the patient during an MRT measurement is thus prevented through suitable arrangement of these areas. In order to avoid an excessive pressure on the patient, the coil housing has an escape opening 10 in accordance with FIG. 3, for example, or offers space within the coil housing. The membrane 7 exhibits a higher restoring force at these points (e.g., as a result of greater wall thickness) and only deforms when a previously defined limit pressure is reached, which limits the immobilization pressure exerted on the patient. The remaining travel of the upper part is thus compensated for by way of this area. The volume areas 6 are dimensioned such that the travel of the projecting elements 4 on the upper part 2 is sufficient to immobilize head K of different head sizes in the coil 106, and the tolerance is channeled via the escape areas 10. When the head coil 106 is completely closed, the coil parts are, for example, locked by one or more snap-action connections 11. This maintains the stability of the patient immobilization and defines the closing operation of the coil 106 as completed.

Opening the snap-action connection 11 gives the volume areas 6 freedom of movement (e.g., in order to expand the upper area (resting against 5) of the volume area such that the lower area B of the volume area moves away from the patient in each case).

The volume of a volume area pressed into the coil interior space relaxes and shifts due to the restoring force of the membrane 7, releases the patient immobilization device and simultaneously raises the coil upper part 2. If the coil upper part 2 is connected electrically to the coil lower part via plug-in contacts, the restoring force of the membrane serves simultaneously as an ejector (e.g., for disconnection) for the contacts.

Volume areas 6 may also be present additionally or as an alternative in the upper part 2 and are driven correspondingly by projecting elements in the lower part 3. This is advantageous, for example, if the head is to be additionally immobilized at the forehead. The coil upper part may not be pressed vertically onto the coil lower part. An immobilization mechanism may also be driven by horizontal displacement of the coil parts with respect to one another or by a folding mechanism between coil lower part and coil upper part.

The principle of "utilizing the closing movement of the coil" to provide patient immobilization also functions with conventional immobilization elements such as cushions, for example. The cushions may be pressed against the patient, for example, by sprung pressure plates. In this situation, a mechanical system (e.g., tilting lever) is used to divert the closing direction of the coil 106 into the pressure direction with respect to the patient. The restoring force is provided by the spring. In the example described, the restoring force is implemented via the elastic membrane.

With the embodiment described above, the immobilization of a patient in surface coils is implemented automatically by the closure of a coil 106 configured, for example, as a lower part and an upper part. No additional manual actions on the part of the operating personnel are to be provided. With a sufficiently large volume of volume areas 6, the immobilization device adapts to any patient size. The immobilization device may be implemented in punctiform or planar fashion (e.g., with regard to the contact surface on the patient). The number of immobilization points does not increase the workload of the operating personnel. This is an optimized "workflow" for this point of the examination. Patient comfort increases if no annoying manual actions around the head are required. When the coil 106 is opened, the upper part is moved automatically, and the patient immobilization device is released, the coil 106 is ready for the next patient.

Possible advantages may include, for example: an integrated patient immobilization device in the coil housing; no separate immobilization elements that may be lost are required; the closure of the coil 106 performs two functions, completion and patient immobilization; no additional manual actions are required to achieve immobilization; patient comfort; the workflow may be optimized; time-saving integrated solution; ejection aid when unlocking the upper part; no limit on the number of immobilization points because the drive workload remains the same; immobilization possible in punctiform or planar fashion; drive for the immobilization possible through any direction of movement of the coil parts with respect to one another (e.g., horizontal, vertical, diagonal, folding); adaptable to any patient size; broad application spectrum, as the mode of immobilization may be implemented in any volume coil (e.g., head, neck, knee, foot, wrist); the immobilization mechanism may be integrated in one, in a plurality or in each individual housing part of the coil; and as a result of closing the surface coil, a medium enclosed in an elastic membrane is displaced to the effect that the medium may be utilized for patient immobilization.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) local coil comprising:
   at least two parts that are moveable relative to one another,
   wherein a first part of the at least two parts is a local coil lower part, and a second part of the at least two parts is a local coil upper part,
   wherein the second part includes at least one element that, in a closed state of the MRT local coil, is operable to press directly or via at least one pressure element on at least one closed volume in the first part,
   wherein a portion of the at least one closed volume is displaceable by the press, in the closed state of the local coil, from within an interior portion of the first part into a coil interior space inside the local coil until the at least one closed volume rests against a patient, and
   wherein the at least one closed volume contains a liquid or gaseous medium.

2. The MRT local coil as claimed in claim 1, wherein the local coil upper part is removable or operable to be folded away from the local coil lower part such that the MRT local coil is openable.

3. The MRT local coil as claimed in claim 1, wherein the local coil upper part is placeable in position onto the local coil lower part such that the MRT local coil is closeable.

4. The MRT local coil as claimed in claim 3, wherein the at least one element projects from the MRT local coil during the closure of the MRT local coil, and
   wherein the at least one element is configured to reach the local coil lower part before the MRT local coil has completely closed.

5. The MRT local coil as claimed in claim 1, wherein, in the closed state of the MRT local coil, the at least one element is operable to press directly or via planar pressure elements in the local coil lower part onto the at least one closed volume, and
   wherein the at least one closed volume is sealed such that a medium is storable in the at least one closed volume.

6. The MRT local coil as claimed in claim 1, wherein, in the closed state of the MRT local coil, the at least one element is operable to press directly or via pressure elements in the local coil lower part onto the at least one closed volume, and
   wherein the at least one closed volume is enclosed by an elastic membrane.

7. The MRT local coil as claimed in claim 6, wherein the elastic membrane in the local coil lower part includes at least one area having an access into the coil interior space inside the local coil.

8. The MRT local coil as claimed in claim 7, wherein the coil interior space inside the local coil comprises an area of a housing opening.

9. The MRT local coil as claimed in claim 1, wherein on closure of the MRT local coil, the at least one element projects and is operable, in the closed state of the MRT local coil, to press directly or via pressure elements in the local coil lower part onto the at least one closed volume, and
   wherein the at least one closed volume contains a medium.

10. The MRT local coil as claimed in claim 1, wherein a membrane or an expandable area of a membrane of the at least one closed volume has the form of a bellows.

11. The MRT local coil as claimed in claim 1, wherein when during closure of the MRT local coil the local coil upper part is pressed onto the local coil lower part, the at least one closed volume is deformed, displaced, or deformed and displaced such that an expandable membrane area passes through at least one opening in the MRT local coil until the expandable membrane area reaches a patient contour, fills a space between the patient and a local coil housing, or reaches the patient contour and fills the space between the patient and the local coil housing.

12. The MRT local coil as claimed in claim 11, wherein the local coil housing comprises an escape opening to outside the local coil for the at least one closed volume.

13. The MRT local coil as claimed in claim 11, wherein the local coil housing includes free space inside the local coil housing for an expansion of the at least one closed volume.

14. The MRT local coil as claimed in claim 12, wherein in an area of the escape opening of the local coil housing, in an area of an expansion free space, or in an area of the escape opening and the expansion free space, a membrane of the at least one closed volume exhibits a higher restoring force than elsewhere.

15. The MRT local coil as claimed in claim 14, wherein in an area of the escape opening of the local coil housing, in an area of an expansion free space, or in the area of the escape opening and the expansion free space, the membrane of the at least one closed volume exhibits the higher restoring force than elsewhere as a result of greater wall thickness.

16. The MRT local coil as claimed in claim 11, wherein a membrane of the at least one closed volume, in an area of an escape opening of the local coil housing, in an area of an expansion free space, or in an area of the escape opening and the expansion free space, is configured such that the membrane only deforms when a
   predefined limit pressure is reached, which limits an immobilization pressure exerted on the patient.

17. The MRT local coil as claimed in claim 1, wherein the at least one closed volume is dimensioned such that travel of the at least one element on the local coil upper part is sufficient in order to immobilize different head sizes in the MRT local coil.

18. The MRT local coil as claimed in claim 1, further comprising a snap-action connection operable to lock the MRT local coil in a completely closed state.

19. The MRT local coil as claimed in claim 1, wherein as a result of opening a locking device of the MRT local coil, the at least one closed volume is given freedom of movement in an area between the local coil upper part and the local coil lower part of the MRT local coil.

20. The MRT local coil as claimed in claim 1, wherein as a result of opening a locking device of the MRT local coil, a volume of the at least one closed volume pressed into the coil interior space shifts due to a restoring force of a membrane of the at least one closed volume in order to release a patient immobilization device, raise the local coil upper part, or a combination thereof.

21. The MRT local coil as claimed in claim 6, wherein a restoring force of the elastic membrane is an ejector for electrical plug-in contacts between the local coil upper part and the local coil lower part.

22. The MRT local coil as claimed in claim 1, wherein the local coil upper part is placeable in position vertically relative to the local coil lower part, is displaceable horizontally, is foldable using a folding device, or a combination thereof.

23. The MRT local coil as claimed in claim 1, wherein at least one cushion is provided as an immobilization element for immobilizing the patient in the MRT local coil.

24. The MRT local coil as claimed in claim 1, further comprising sprung pressure plates operable to press at least one volume element against the patient,
   wherein at least one spring, an elastic membrane, or the at least one spring and the elastic membrane are operable to provide a restoring force.

25. The MRT local coil as claimed in claim 1, wherein the MRT local coil is a volume coil.

26. The MRT local coil as claimed in claim 1, wherein the MRT local coil is a head, neck, knee, foot, or wrist local coil.

\* \* \* \* \*